United States Patent
Kvarnström (12)

(10) Patent No.: US 11,009,121 B2
(45) Date of Patent: May 18, 2021

(54) GEARSHIFT ASSEMBLY INCLUDING A POSITION SENSOR ASSEMBLY

(71) Applicant: Kongsberg Automotive AB, Mullsjö (SE)

(72) Inventor: Anders Kvarnström, Jönköping (SE)

(73) Assignee: Kongsberg Automotive AB, Mullsjö (SE)

( * ) Notice: Subject to any disclaimer, the term of this patent is extended or adjusted under 35 U.S.C. 154(b) by 326 days.

(21) Appl. No.: 15/902,324

(22) Filed: Feb. 22, 2018

(65) Prior Publication Data

US 2018/0180170 A1   Jun. 28, 2018

Related U.S. Application Data

(63) Continuation-in-part of application No. PCT/EP2015/070175, filed on Sep. 3, 2015.

(51) Int. Cl.
*F16H 59/00* (2006.01)
*F16H 59/04* (2006.01)
(Continued)

(52) U.S. Cl.
CPC ......... *F16H 59/044* (2013.01); *F16H 59/105* (2013.01); *G01D 11/24* (2013.01); *F16H 2059/026* (2013.01); *G01R 33/06* (2013.01)

(58) Field of Classification Search
CPC .. F16H 69/0204; F16H 59/044; F16H 59/105; F16H 2059/026; G01D 11/24; G01R 33/06
(Continued)

(56) References Cited

U.S. PATENT DOCUMENTS

| 3,913,115 A | 10/1975 | Mueller et al. |
| 5,307,918 A | 5/1994 | Rivera et al. |

(Continued)

FOREIGN PATENT DOCUMENTS

| DE | 19608981 A1 | 9/1997 |
| DE | 10319720 B3 | 9/2004 |

(Continued)

OTHER PUBLICATIONS

English language abstract for EP1992845A2 extracted from espacenet.com database on Mar. 14, 2018, 2 pages.
(Continued)

*Primary Examiner* — Victor L Macarthur
(74) *Attorney, Agent, or Firm* — Howard & Howard Attorneys PLLC

(57) ABSTRACT

A gearshift assembly comprises a shift lever pivotable about first and second axes, a sensor assembly comprising first and second paths of sensors, and a sensor triggering element mounted on an element carrier moveably mounted in a housing and coupled to the shift lever to enable movement of the sensor triggering element along the sensors in response to movements of the shift lever. The element carrier is moveably supported by a guide structure in the housing and coupled by a hinge connection to a link with the link connected to the shift lever. The element carrier performs linear movement in response to pivoting of the shift lever about the first axis to move the sensor triggering element along the first path of sensors, and is pivoted in response to pivoting of the shift lever about the second axis to pivot the sensor triggering element along the second path of sensors.

19 Claims, 5 Drawing Sheets

(51) Int. Cl.
  *F16H 59/10* (2006.01)
  *G01D 11/24* (2006.01)
  *F16H 59/02* (2006.01)
  *G01R 33/06* (2006.01)
(58) Field of Classification Search
  USPC .................. 74/473.12, 473.18, 473.33
  See application file for complete search history.

(56) References Cited

U.S. PATENT DOCUMENTS

| | | | |
|---|---|---|---|
| 5,689,996 | A | 11/1997 | Ersoy |
| 6,530,293 | B1 | 3/2003 | Ruckert et al. |
| 7,086,306 | B2 | 8/2006 | Syamoto et al. |
| 7,293,480 | B2 * | 11/2007 | Matsui .............. F16H 59/105 74/471 XY |
| 7,614,319 | B2 | 11/2009 | Hermansson et al. |
| 8,333,128 | B2 | 12/2012 | Schober et al. |
| 2005/0028631 | A1 | 2/2005 | Watkins |
| 2008/0041182 | A1 | 2/2008 | Giefer et al. |
| 2010/0175494 | A1 * | 7/2010 | Schober .............. G01D 5/202 74/473.12 |
| 2010/0242654 | A1 | 9/2010 | Corney |
| 2011/0202242 | A1 | 8/2011 | Habenschaden |
| 2016/0377174 | A1 | 12/2016 | Voelz et al. |
| 2017/0122429 | A1 | 5/2017 | Kvarnstrom |

FOREIGN PATENT DOCUMENTS

| | | |
|---|---|---|
| DE | 102006021078 B3 | 8/2007 |
| DE | 102006044404 B4 | 3/2009 |
| EP | 1992845 A2 | 11/2008 |
| JP | S6136751 U | 3/1986 |
| JP | 2008239057 A | 10/2008 |
| WO | 2015032454 A1 | 3/2015 |

OTHER PUBLICATIONS

International Search Report for Application No. PCT/EP2015/070175 dated May 10, 2016, 3 pages.
English language abstract for DE19608981A1 extracted from espacenet.com database on Oct. 18, 2018, 2 pages.
English language abstract for DE10319720B3 extracted from espacenet.com database on Oct. 18, 2018, 1 page.
English language abstract for DE102006021078B3 extracted from espacenet.com database on Oct. 18, 2018, 1 page.
English language abstract for DE102006044404B4 extracted from espacenet.com database on Oct. 18, 2018, 2 pages.
International Search Report for International Application No. PCT/EP2014/055451 dated Nov. 4, 2014, 3 pages.

* cited by examiner

GEARSHIFT ASSEMBLY INCLUDING A POSITION SENSOR ASSEMBLY

The subject application is a Continuation-in-Part of International Patent Application No. PCT/EP2015/070175, filed on Sep. 3, 2015, the contents of which are incorporated herein by reference in their entirety.

The present invention is directed to a gearshift assembly for a transmission of a vehicle comprising a shift lever which is mounted in a housing to be pivotable about a first axis from a neutral position backwards and forwards, and about a second axis perpendicular to the first from the neutral position in lateral direction to the left and to the right; a position sensor assembly mounted stationary in the housing and comprising a plurality of position sensors disposed in a distributed pattern including two paths of position sensors; and a sensor triggering element mounted on an element carrier which is moveably mounted in the housing and coupled to the shift lever in such a manner to be able to move the sensor triggering element along said pattern of position sensors in response to pivotal shift movements of the shift lever about the first and second axes.

Such gearshift assemblies are for example utilized in shift-by-wire gearshift assemblies or in Tip-Tronic shifters (including mechanical PRND and a manual shifting mode) in which the positioning of the shift lever is detected by a position sensor assembly, and a corresponding control signal is transmitted to the transmission of the vehicle for actuating it in the desired manner. There is a sensor triggering element (e.g. a magnet) which is moved in response to shift lever movements along a path of position sensors, wherein a particular position sensor is activated when the sensor triggering element is positioned in close proximity to the particular position sensor.

A gearshift assembly according to the preamble of claim 1 is disclosed in U.S. Pat. No. 7,614,319 B2. A shift lever is mounted in a housing to be pivotable about a first axis, and about a second axis perpendicular to the first axis. A position sensor assembly is mounted stationary in the housing and comprises a plurality of position sensors distributed in a planar pattern on a vertical wall. A sensor triggering element is mounted on an element carrier which is connected to the shift lever such that it follows the pivotable shift movements of the shift lever about the first axis. This movement of the element carrier is accompanied by moving the sensor triggering element along a first one of the paths of position sensors. The position sensor that is in close proximity to the sensor triggering element signals the presence of the sensor triggering element and thus gives an indication of the positioning of the shift lever. In the gearshift assembly disclosed there is a second path of position sensors displaced vertically above the first part of sensors. By pivoting the shift lever about the second axis the remote end of the element carrier is vertically moved, and in this manner the sensor triggering element may be moved between the first and second paths of the pattern of sensor elements.

The element carrier is connected to the shift lever at a position spaced apart from the pivotal mounting of the shift lever. The element carrier presses the sensor triggering element against a wall on which the pattern of position sensors is mounted. During shift movements of the shift lever the sensor triggering element slides along the wall and the position sensors. The distances the sensor triggering element travels during pivotal shift movements of the shift lever depends only on the vertical distance of the sensor triggering element from the pivotal bearing of the shift lever in the housing.

For such gearshift assemblies there are two conflicting design goals. On the one hand it is desired to realize a compact gearshift assembly design. This requires that the length of the shift lever extending vertically below the pivotal bearing is limited. This implies rather short travelling distances of the lower end of the shift lever to which the element carrier is coupled when the shift lever is moved between the shift positions, and this in turn implies rather short distances between the sensor triggering element positions corresponding to the shift positions. On the other hand it is desired that the position sensor assembly gives a good spatial resolution in indicating the shift lever position, or in other words gives a reliable indication of the actual shift lever position. For this aspect it would be desirable to have the position sensors for subsequent shift positions to be spaced apart by a certain minimum distance so that the position sensor assembly can in a reliable manner discriminate between different positions of the sensor triggering element and thus of the shift lever.

Another problem of the gearshift assembly of U.S. Pat. No. 7,614,319 B2 is that the position sensors are attached on a wall that is laterally displaced at a distance to the shift lever and that is oriented in a vertical plane. Thus, extra space is needed on one side of the shift lever to accommodate the wall carrying the pattern of position sensors.

It is an object of the present invention to provide a gearshift assembly which allows to be realized in a compact design and which allows to accurately and efficiently discriminate between the various positions of the shift lever.

This object is achieved by gearshift assembly comprising the features of claim 1. Preferred embodiments of the invention are set out in the dependent claims.

According to the present invention the pattern of position sensors is arranged in a horizontal plane next to the shift lever at a vertical level of a lower end region thereof. The element carrier is moveably supported by a guide structure in the housing, the element carrier is coupled by a hinge to a link which in turn is connected to the shift lever. The coupling of the element carrier to the shift lever and the guide structure of the element carrier are arranged such that the element carrier performs a linear movement in response to pivoting the shift lever about the first axis such that the sensor triggering element is moved perpendicular to the first axis along a first horizontal path of the position sensor pattern, and that the element carrier is pivoted about a vertical pivot axis of the guide structure at a distance to the sensor triggering element in response to pivoting the shift lever about the second axis such that the sensor triggering element is pivoted along a second horizontal path of the position sensor pattern.

The combination of a linear horizontal movement of the sensor triggering element along a first horizontal path perpendicular to the first axis and a pivotal movement of the element carrier about a vertical pivot axis spaced apart from the sensor triggering element such that the sensor triggering element is pivoted along a second horizontal path allows for a compact design since this implies that the first and second path intersect and that the position sensor can be arranged in a cross shape along the first and second paths such that the position sensor are distributed in a compact cluster. This requires less area than two separate paths at a distance to each other. Furthermore, orienting the position sensor pattern in a horizontal plane allows to place the arrangement in close proximity in front of or behind the lower end region of the shift lever which is also in favor of a compact design.

In addition, the transmission of the pivoting of the shift lever about the second axis to a pivotal movement of the element carrier permits to design this transmission with a transmission ratio greater than 1, which means that the sensor triggering element on the element carrier travels a larger distance than the lower end portion of the shift lever to which it is coupled. Therefore, the position sensors can be placed at larger distances to each other along the second path which improves the capability to discriminate between shift lever positions sensed by the position sensors.

In a preferred embodiment the guide structure comprises a pivot pin stationary in the housing. The element carrier comprises a fork portion or bifurcated portion providing an elongated slot. The pivot pin is received in the elongated slot of the fork portion such that the element carrier is able to perform the linear movement by letting the pivot pin slide relative to the elongated slot of the fork portion and such that the element carrier is able to perform the pivotal movement by letting the fork portion of the element carrier pivot about the pivot pin.

In one embodiment the pivot pin has an enlarged tip that extends laterally over the fork portion of the element carrier to prevent movement of the element carrier in axial direction of the pivot pin. In this manner the fork portion is supported by the enlarged tip of the pivot pin in one axial direction of the pin, and by the surface from which the pin projects in the opposite axial direction, while the element carrier is still able to slide along the pivot pin in a linear motion, and to pivot about the pivot pin.

In a preferred embodiment the gearshift assembly and its element carrier are arranged such that, when the gearshift assembly is mounted in a vehicle and the shift lever is in the neutral position with respect to second pivotal axis, the first pivotal axis is oriented perpendicular to the longitudinal direction of the vehicle. Then the slot of the fork portion of the element carrier is extending parallel to the longitudinal direction such that the element carrier performs a linear movement in longitudinal direction in response to pivoting the shift lever about the first axis such that the sensor triggering element moves along the first path of position sensors which extends in the longitudinal direction of the vehicle.

In a preferred embodiment the fork portion of the element carrier is disposed at an end portion of the element carrier remote from the link and the shift lever in forward direction, wherein an opening of the elongated slot of the fork portion is facing away from the link and the shift lever.

In a preferred embodiment the hinge connecting the link to the element carrier is formed as a ball joint.

In a preferred embodiment the link is connected to the shift lever by a swivel connection which comprises two opposite openings formed at the lower end region of the shift lever, and the link is formed with a bifurcated end portion being provided with two opposite pins facing each other to be received the opposite openings of the shift lever.

In an alternative embodiment the link is connected to the shift lever by a swivel connection which comprises a mounting pin formed at the lower end region of the shift lever with two opposite end portions, and a bifurcated end portion formed on the link and being provided with two opposite holes facing each other for receiving the opposite end portions of the mounting pin. The holes can also be open at their outer ends so that ends of the legs of the bifurcated end portion have a C-shape and can be pushed onto the end portions of the mounting pin.

In a preferred embodiment the link, the element carrier and the pivot of the guide structure are arranged such that a movement of the shift lever end region about the second axis is transmitted to a movement of the sensor triggering element with a transmission ratio of greater than 1. In other words the distance travelled by the sensor triggering element in response to pivoting the shift lever about the second axis is larger than the distance travelled by the end region of the shift lever to which the link is coupled.

In a preferred embodiment the first and second paths of the position sensor pattern intersect and are extending perpendicular to each other.

The invention will now be described with reference to a preferred embodiment shown in the drawings in which:

FIG. 1 shows an exploded view of an embodiment of the gearshift assembly;

FIGS. 2*a*-2*e* show plan views of the gearshift assembly with the shift lever in the neutral position (a), shifted forward (b), shifted rearward (c), pivoted laterally to the left (d), and pivoted laterally to the right (e);

The main components of the gearshift assembly of this embodiment will be described first with reference to FIG. 1. Additional details of the gearshift assembly are described below with reference to FIGS. 3-5. The operation of this embodiment will be described further below with reference to FIGS. 2*a*-2*e*.

Figure 1:
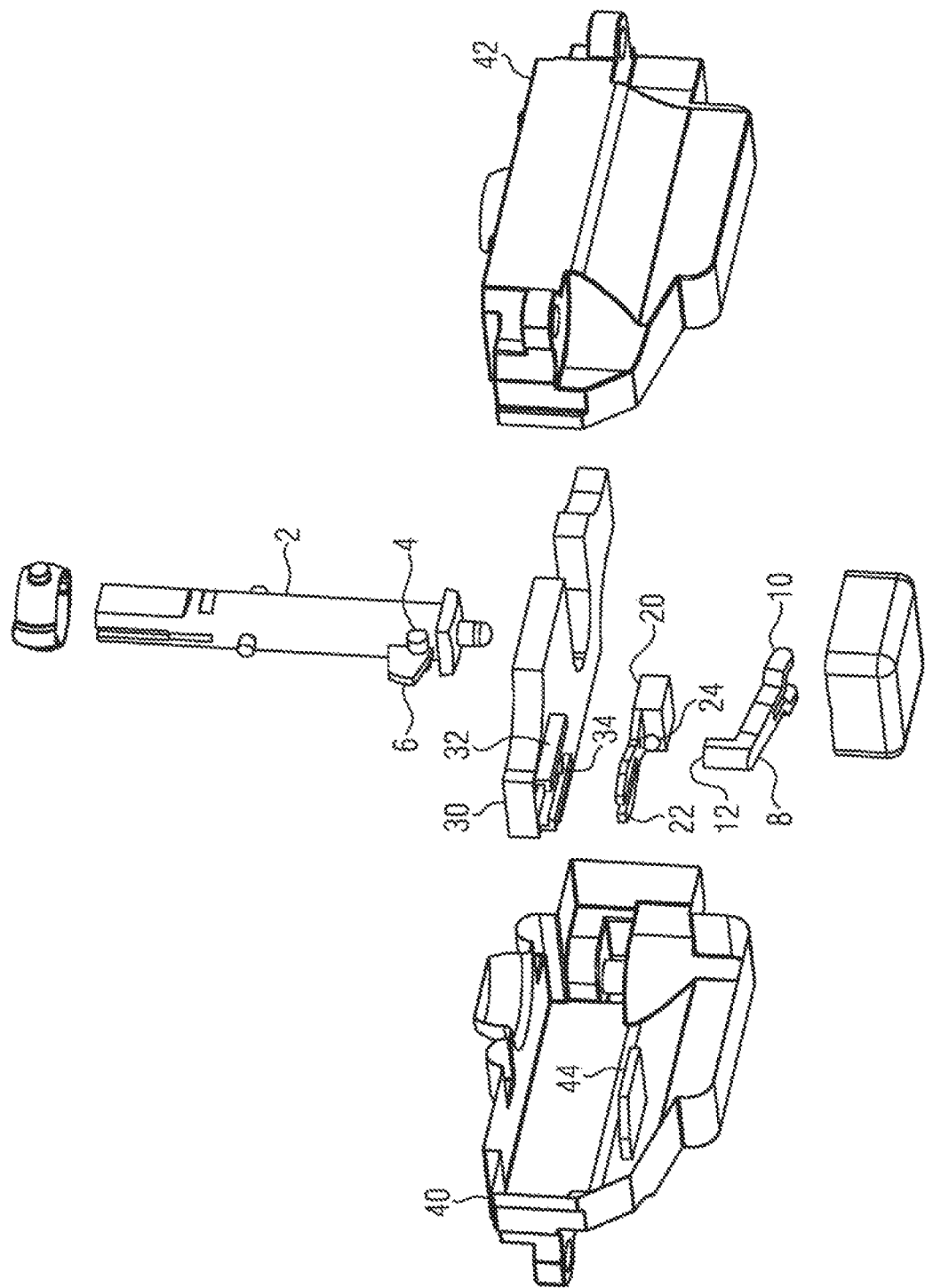

FIG. 1 is an exploded view of the main components of an embodiment of gearshift assembly. The gearshift assembly comprises a housing to be mounted in a vehicle. The housing is assembled by joining two housing halves 40 and 42. When the housing halves 40 and 42 are put together a spherical socket is formed inside for receiving a complementary ball portion provided on the shift lever 2. In this manner shift lever 2 is supported in the housing to be pivotable about a first axis from a neutral position backwards and forwards and about a second axis perpendicular to first axis from the neutral position in lateral direction to the left and to right. "Forwards" and "backwards" is in the longitudinal direction (driving direction) when the gearshift assembly is mounted in the vehicle. To guide shift movements the shift lever 2 comprises a detent plunger at its lower end which slides along a detent track (not shown in FIG. 1) which is stationary in the housing and which is arranged to let the shift lever 2 engage in the shift positions of the shift pattern and to provide a haptic feedback to the driver.

Within the housing, and partially surrounding the shift lever 2 in a lower end region thereof, there is mounted a printed circuit board box 30 which houses a printed circuit board on which an array of position sensors 50 is mounted which will be discussed in more detail below.

There is a sensor triggering element disposed within an element carrier 20. The element carrier 20 comprises a box portion at one of its ends in which the sensor triggering element is disposed, for example magnet. At the opposite end the element carrier 20 is provided with bifurcated end portion 22. The element carrier 20 further comprises a ball 24 formed thereon.

The element carrier 20 is mounted in the housing such that its bifurcated end portion 22 is received between opposite guide walls 32 formed on the lower surface of the printed circuit board box 30. The guide walls 32 have inwardly extending projections at their edges remote from the printed circuit board box 30. In this manner the bifurcated end portion 22 of the element carrier 20 is received in the space between the opposite guide walls 32.

In the center between the two opposite guide walls 32 a pivot pin 34 is provided. The pivot pin 34 is received within the elongated slot formed between the two legs of the bifurcated end portion 22 of the element carrier 20. In this manner the element carrier 20 is supported in a guide structure formed by the two opposite walls 32 and the pivot pin 34 in such a manner that it can move linearly by sliding between the two opposite guide walls 32 forth and back, and by letting the bifurcated end portion 22 of the element carrier 20 pivot about the pivot pin 34. The latter pivotal movement about pivot pin 34 lets the box portion of the element carrier opposite to the bifurcated end portion 22 move laterally to the left and to the right.

For coupling the element carrier 20 to the shift lever 2 a link 8 is provided. The link 8 has a fork or bifurcated end portion 10. The two legs of the bifurcated end portion 10 each comprise a hole on the inner side wall. The two holes being aligned and opposite to each other, and are arranged to receive opposite ends of a mounting pin 4 formed close to the lower end of shift lever 2. In this manner the link 8 is coupled to the shift lever 2 by a swivel connection. Furthermore, a tongue 6 is provided on the shift lever 2 which is received in the slot between the two legs of the bifurcated end portion 10 of link 8. The tongue 6 within the slot of the bifurcated end portion 10 of the link 8 allows pivoting about the mounting pin 4 but stabilizes the link 8 in all other directions.

Alternatively, the positioning of the mounting pins and holes could be reversed, i.e. the mounting pins could be located on the inner sides of the legs of the bifurcated end portion 10 and be aligned pointing towards each other, whereas receiving holes could be provided close to the lower end of the shift lever for receiving the mounting pins to form a swivel connection.

At its end opposite to the bifurcated end portion 10 the link 8 is provided with an upwardly projecting head in which a socket 12 is formed on the upper surface thereof. This socket 12 is arranged for receiving the ball 24 formed on the lower surface of the element carrier 20. When the ball 24 is received within socket 12 of the link 8, element carrier 20 and link 8 are coupled by a ball joint forming a hinge connection.

For further supporting the element carrier 20 tongues 44 are provided within the housing (only tongue 44 of the left housing half 40 is visible in FIG. 1, but there is symmetrically provided an opposite tongue in the right housing half 42). The tongues 44 are arranged in the housing such that the bifurcated end portion 10 of link 8 is disposed vertically below the tongues 44. The upwardly projecting head of the link 8 is disposed in front of the tongues 44 such that the upper end of the projecting head with the socket 12 is disposed vertically above tongues 44. The element carrier 20 is disposed with its end portion opposite to the bifurcated end portion 22 vertically above tongues 44 such that this part of the element carrier 20 is supported by and can slide along the upper surface of tongues 44.

Further details of the gearshift assembly are described below with reference to FIGS. 1 and 3-5. As previously mentioned, the gearshift assembly comprises the housing having the two housing halves 40, 42 joined to one another. The housing halves 40, 42 together form a socket for receiving a complementary ball portion of the shift lever 2.

The shift lever 2 is mounted in the housing. In an embodiment, the shift lever 2 has the lower end region including the ball portion, and the ball portion is seated in the socket formed by the joined housing halves 40, 42 to enable the shift lever 2 to pivot about first $A_{L1}$ and second $A_{L2}$ lever axes. The first lever axis $A_{L1}$ is transverse to the second lever axis $A_{L2}$. In an embodiment, the first lever axis $A_{L1}$ is perpendicular to the second lever axis $A_{L2}$. The shift lever 2 is pivotable about the first lever axis $A_{L1}$ from a neutral position backwards and forwards and pivotable about the second lever axis $A_{L2}$ from the neutral position in a lateral direction. As used herein, the terms backwards and forwards refer to movement of the shift lever 2 in the longitudinal direction of the vehicle when the gearshift assembly is mounted in the vehicle. As also used herein, the lateral direction refers to the movement of the shift lever 2 in a direction transverse to the longitudinal direction of the vehicle. In an embodiment, the movement of the shift lever 2 in the lateral direction includes side-to-side movement. The housing has a detent track and the shift lever 2 has a detent plunger at the lower end region that slides along the detent track of the housing. The detent track is arranged to enable the shift lever 2 to engage in shift positions and to provide haptic feedback to the driver.

The gearshift assembly further comprises the position sensor assembly 52 mounted in the housing. The position sensor assembly 52 comprises the plurality of position sensors 50 disposed in a distributed pattern including first 54 and second 56 paths of position sensors 50. The position sensors 50 are arranged in a plane P next to the lower end region of the shift lever 2. Additionally, the first path 54 of position sensors 50 is arranged along the first lever axis $A_{L1}$, and the second path 56 of position sensors 50 is arranged along the second lever axis $A_{L2}$. The second path 56 of position sensors 50 is transverse to the first path 54 of position sensors 50. In an embodiment, the second path 56 of position sensors 50 is perpendicular to and intersects the first path 54 of position sensors 50.

The position sensor assembly 52 further includes the printed circuit board 30. The printed circuit board 30 has opposing upper 36 and lower 38 surfaces with the upper surface 36 facing away from the lower end region of the shift lever 2 and the lower surface 38 facing toward the lower end region of the shift lever 2. The plurality of position sensors 50 is attached to the lower surface 38 of the printed circuit board 30 such that the position sensors 50 face toward the lower end region of the shift lever 2.

The gearbox assembly further comprises the element carrier 20 moveably mounted in the housing and coupled to the shift lever 2. The element carrier 20 has the fork or bifurcated portion 22 defining an elongated slot 28. The element carrier 20 further has the box portion 26 adjacent the fork portion 22 for receiving the sensor triggering element 60. The element carrier 20 further has the ball 24, which is received in and supported by the socket 12 of the link 8 described below. As shown, the carrier element 20 is arranged such that the fork portion 22 faces away from the link 8 and away from the shift lever 2.

The sensor triggering element 60 is mounted on the element carrier 20. In an embodiment, the sensor triggering element 60 is received within and mounted inside the box portion 26 of the element carrier 20. In the illustrated embodiment, the sensor triggering element 60 mounted on the element carrier 20 faces toward the plurality of position sensors 50 attached to the lower surface 38 of the printed circuit board 30. As described in further detail below, the element carrier 20 enables movement of the sensor triggering element 60 along the pattern including the first 54 and second 56 paths of position sensors 50 in response to pivotal shift movements of the shift lever 2 about the first $A_{L1}$ and second $A_{L2}$ lever axes.

The gearshift assembly further comprises the guide structure 31 within the housing and defining a pivot axis $A_P$. The guide structure 31 has a base 64 and a pair of guide walls 32 extending from the base 64. Each of the guide walls 32 has a flange 33 extending inwardly toward one another. The guide structure 31 further has a pivot pin 34 extending from the base 64 between the guide walls 32, with the pivot pin 34 defining the pivot axis $A_P$.

Figure 2:
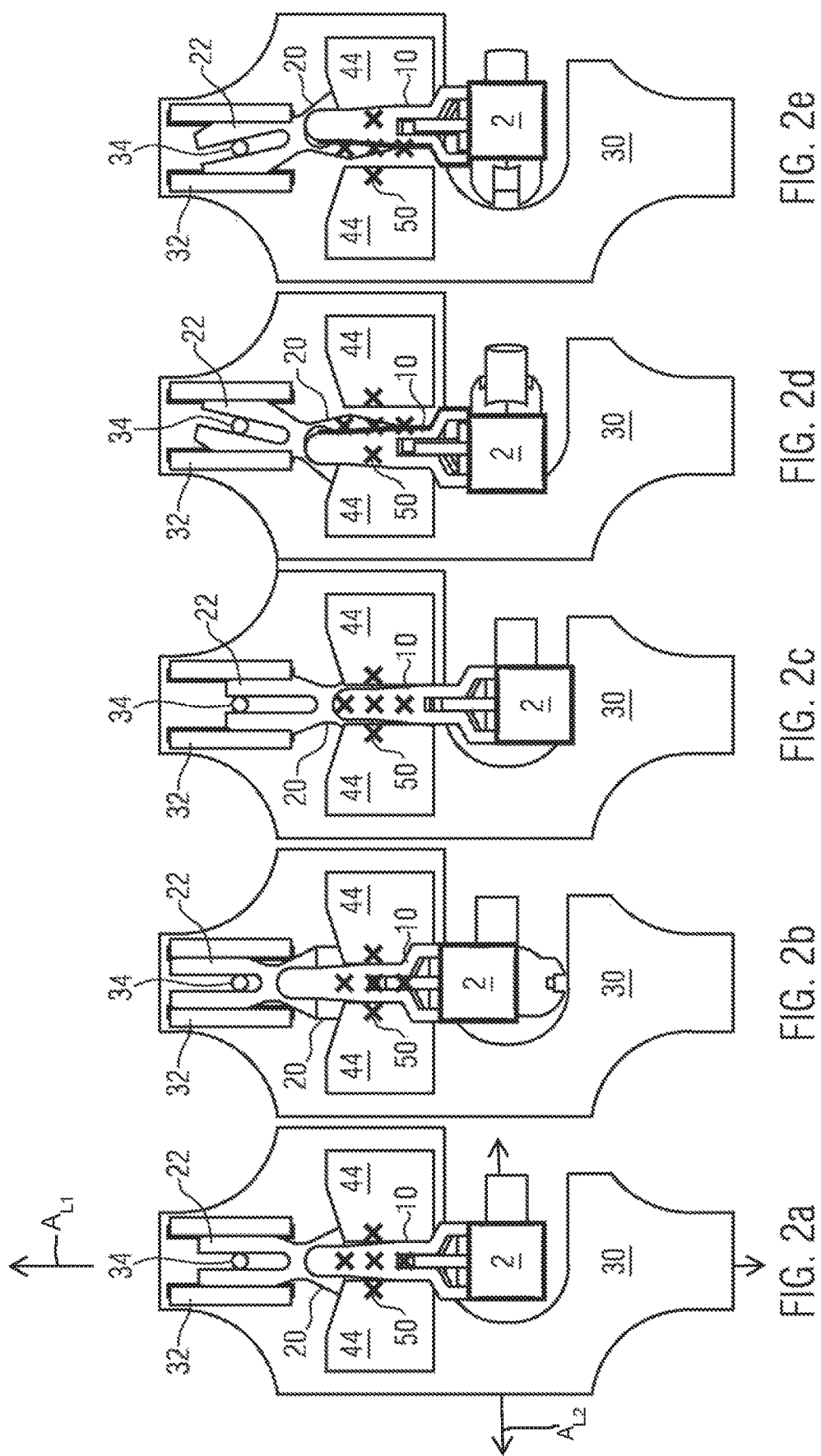

The element carrier 20 is coupled to and moveably supported by the guide structure 31 in the housing. In an embodiment, the pivot pin 34 of the guide structure 31 is received in the elongated slot 28 of the fork portion 22 of the element carrier 20 to enable linear movement of the element carrier 20 relative to the pivot pin 34 as the shift lever 2 pivots along the first lever axis $A_{L1}$ (as shown in FIGS. 2b and 2c). The pivot pin 34 is received in the elongated slot 28 of the fork portion 22 to enable pivoting of the element carrier 20 relative to the pivot pin 34 as the shift lever 2 pivots about the second lever axis $A_{L2}$ (as shown in FIGS. 2d and 2e). Additionally, the fork portion 22 is disposed between the guide walls 32 and the pivot pin 34 is received in the elongated slot 28 to enable linear movement of the element carrier 20 relative to the guide walls 32 and pivoting of the element carrier 20 relative to the pivot pin 34.

The gearbox assembly further comprises the link 8 for coupling the carrier element 20 to the shift lever 2. In an embodiment, the link 8 is connected to the shift lever 2 by a hinge connection 62. As shown, the link 8 has the fork or bifurcated end portion 10. Each leg of the fork portion 10 of the link 8 forms part of the hinge connection 62, and the lower end region of the shift lever 2 forms another part of the hinge connection 62. In an embodiment, the hinge connection 62 may be an aperture-mounting pin connection, which enables the link 8 to swivel relative to the shift lever 2. The link 8 further has the head 66 defining the socket 12 for receiving the ball 24 of the element carrier 20, as mentioned above, to form a ball joint connection between the element carrier 20 and the link 8.

Figure 3:
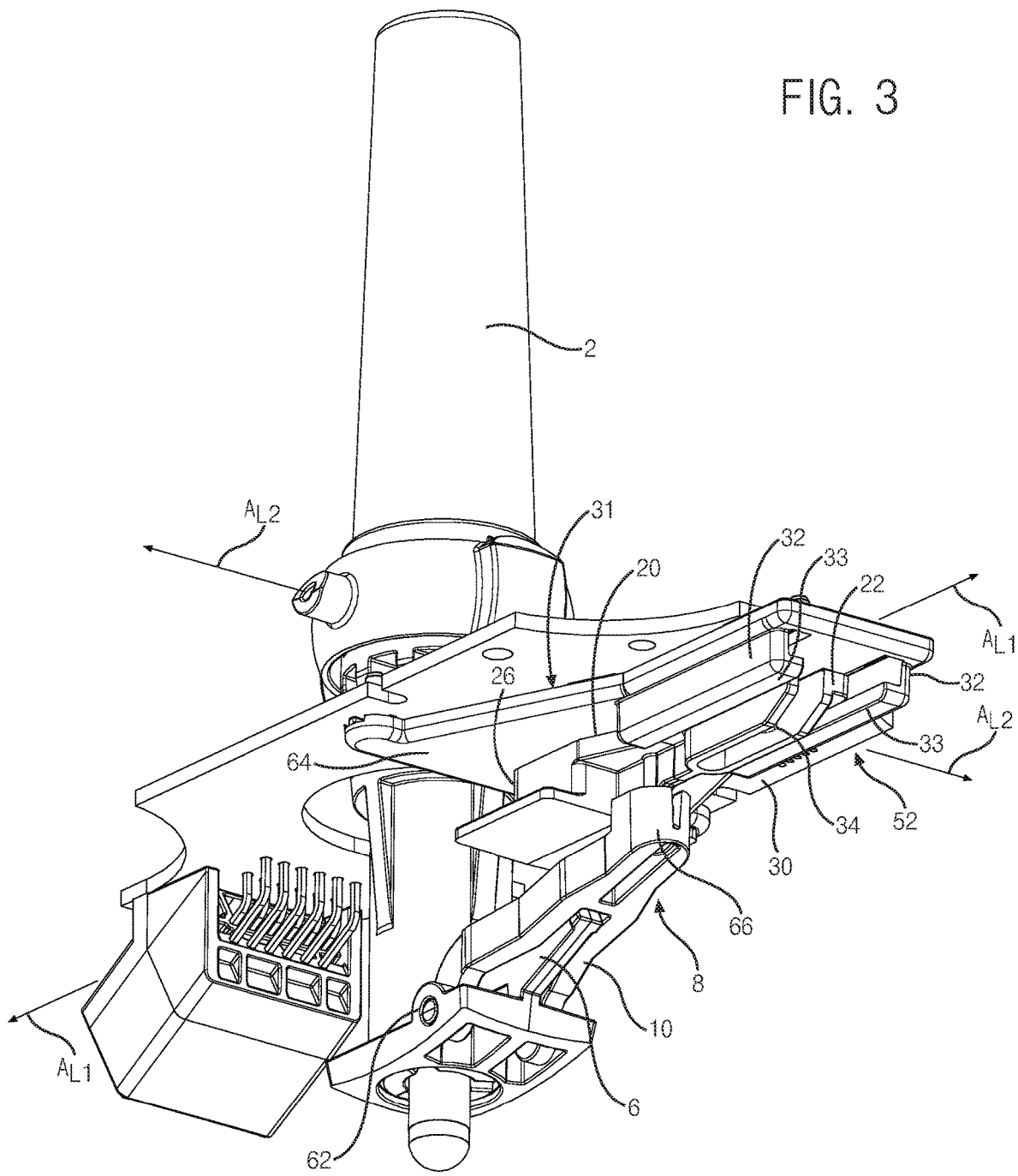
FIG. 3 shows a bottom perspective view of a portion of the gearshift assembly.
Figure 4:
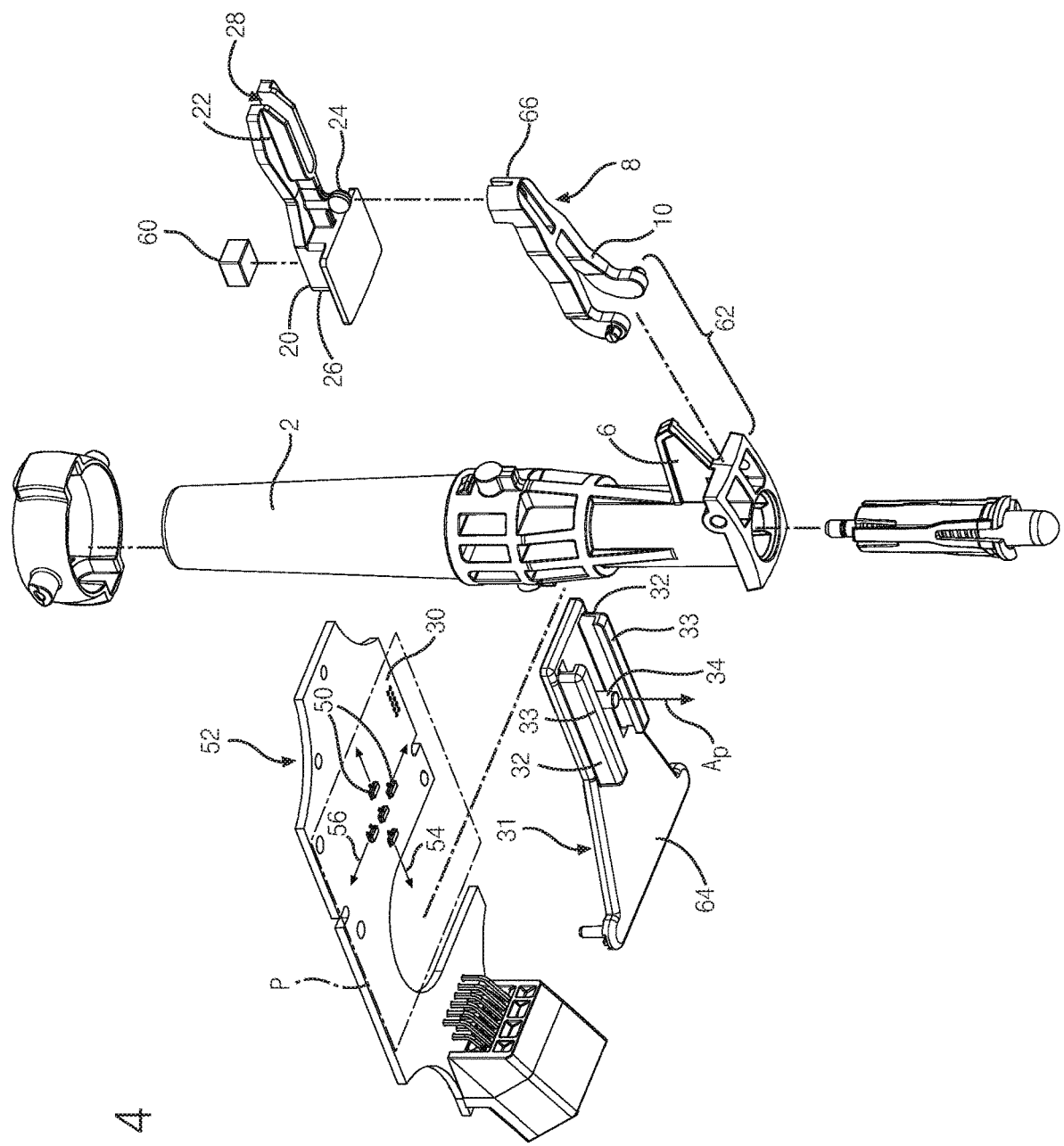
FIG. 4 shows an exploded view of the portion of the gearshift assembly of FIG. 3.
Figure 5:
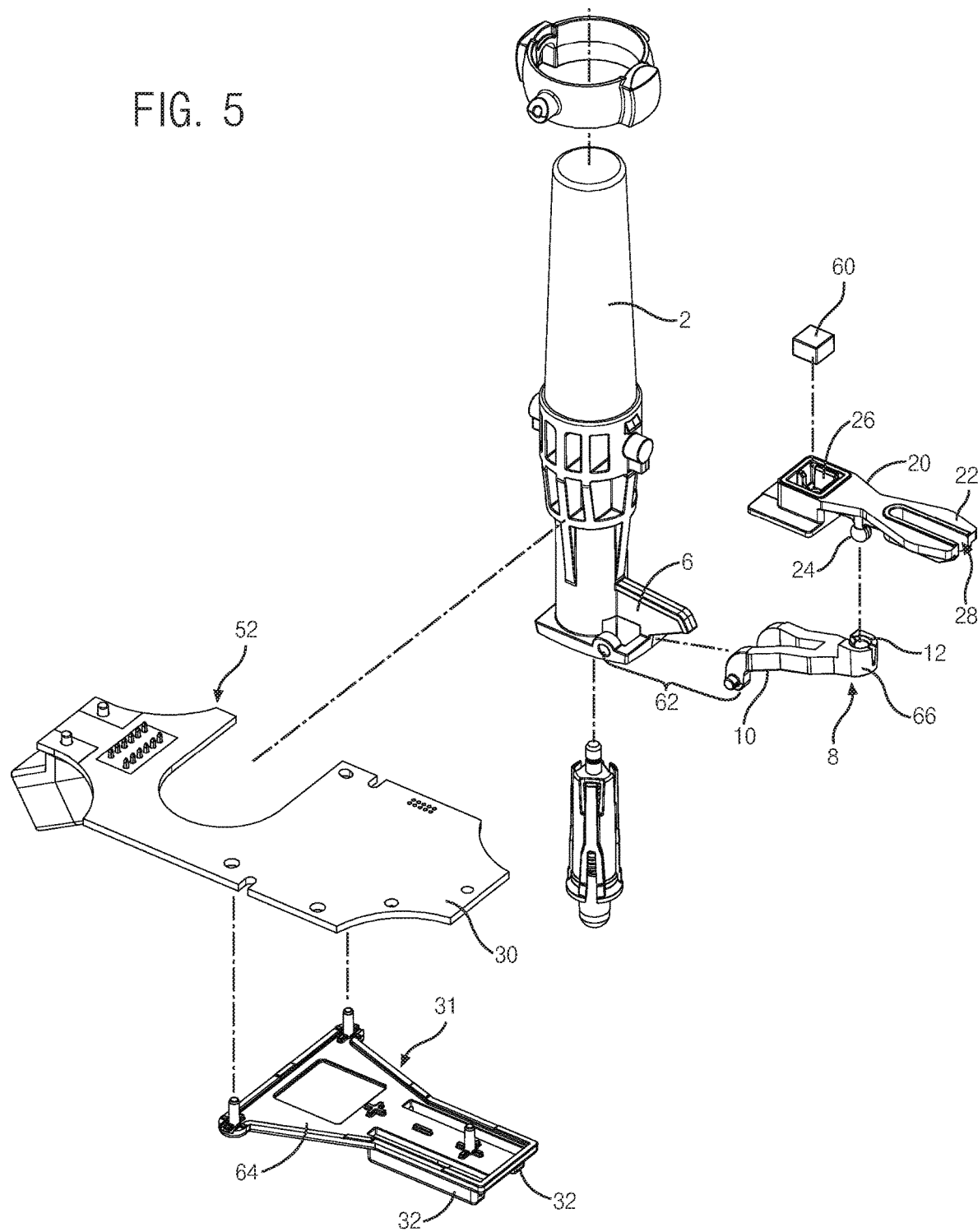
FIG. 5 shows another exploded view of the portion of the gearshift assembly of FIG. 3.

In an embodiment shown in FIGS. 3-5, the shift lever 2 defines a pair of apertures aligned and opposite one another at the lower end region of the shift lever 2, and the link 8 has a pair of mounting pins extending outwardly from each leg of the fork portion 10. The mounting pins are received in respective apertures defined in the lower end region of the shift lever 2 to couple the link 8 to the shift lever 2. Additionally, the shift lever 2 includes the tongue 6, which is received in the slot between the legs of the fork portion 10 of the link 8 to allow the link 8 to pivot about the aperture-mounting pin connection, but stabilizes the link 8 in other directions.

The coupling of the element carrier 20 to the shift lever 2 by the link 8 and the coupling of the element carrier 20 to the guide structure 31 are arranged such that the element carrier 20 performs a linear movement in response to pivoting of the shift lever 2 about the first lever axis $A_{L1}$ to move the sensor triggering element 60 along the first path 54 of position sensors 50 transverse to the second lever axis $A_{L2}$. In addition, the element carrier 20 pivots about the pivot axis $A_P$ of the guide structure 31 at a distance from the sensor triggering element 60 in response to pivoting the shift lever 2 about the second lever axis $A_{L2}$ to pivot the sensor triggering element 60 along the second path 56 of position sensors 50. Further details of the gearshift assembly are provided in connection with the operation of the gearshift assembly, which is described below with reference to FIGS. 2a to 2e.

FIGS. 2a to 2e show schematic plan views from below, i.e. the lower end of the shift lever 2, the lower surface of the printed circuit board box 30, the link 8, the opposite tongues 44 supporting the end portion of the element carrier 20 which houses the sensor triggering element (magnet), and the element carrier 20 are visible. In addition, the pattern of position sensors 50 is indicated (only one of the five position sensors is provided with reference numeral 50). These position sensors 50 are disposed on the printed circuit board inside of the printed circuit board box 30, and would thus not be visible in a plan view from below. However, for a better understanding of the invention, the positions of the five position sensors 50 are indicated in FIGS. 2a to 2e. The position sensors are arranged in a cross pattern forming a horizontal and a vertical path, each having three adjacent position sensors. Here and in the following, the two orthogonal paths of position sensors will be referred to as a "horizontal" and a "vertical" path of sensors as they appear in the views of FIGS. 2a to 2e. However, it should be noted that this reference to "horizontal" and vertical" is made for easier reference only in connection with FIGS. 2a to 2e, and that indeed the two orthogonal paths of position sensors are both disposed in a horizontal plane (Figure plane of FIGS. 2a to 2e) in the gearshift assembly.

In FIG. 2a, the shift lever 2 is in the neutral, central position. In this position the sensor triggering element triggers the central position sensor at the intersection of the two perpendicular sensor paths.

In FIG. 2b, the shift lever 2 has been pivoted backwards (such that its lower end has been moved forward in the view from below in FIG. 2b). This forward movement of the lower end of the shift lever 2 has been transferred by the link 8 to the element carrier 20 such that the element carrier 20 has been moved forward, as can be seen by the linear forward movement of the bifurcated end portion 22 of the element carrier 20 between the opposite guide walls 32 in FIG. 2b. The opposite end of the element carrier 20 has moved forward in the same manner in FIG. 2b such that the sensor triggering element has likewise been moved forward so that now the upper position sensor in the vertical path of position sensors in FIG. 2b is activated.

In FIG. 2c, the shift lever 2 has been pivoted forwards such that its lower end pivoted backwards in the opposite direction. Consequently, link 8 pulled element carrier 20 back, and pulled the bifurcated end portion 22 partially out of the opposing guide walls 32. Due to this backward movement of element carrier 20 the sensor triggering element has been moved linearly along the vertical path of sensors to the lowest position sensor in the vertical path in FIG. 2c.

After the shift lever has been moved back to the neutral position as shown in FIG. 2a, the shift lever is now pivoted laterally such that its lower end is pivoted to the left in FIG. 2d. This movement to the left is transferred by link 8 through a hinge connection (socket 12 and ball 24) to element carrier 20. Since the pivot pin 34 is received between the legs of the bifurcated end portion 22 of the element carrier 20, a pivotal movement of element carrier 20 about pivot pin 34 is caused. This is accompanied by a pivotal or lateral movement of the sensor triggering element at the opposite end of the element carrier 20 to the left hand side in the view of FIG. 2d such that the sensor triggering element has been moved from the central position sensor in FIG. 2a to the position sensor on the left hand side in the horizontal path of position sensors in FIG. 2d.

In FIG. 2e, the shift lever 2 has been pivoted laterally in the opposite direction such that its lower end has been pivoted to the right hand side in the view of FIG. 2e. As described before the lateral movement of link 8 is transferred to the hinge connection (socket 12 and ball 24) and to element carrier 20 such that element carrier 20 pivots about pivot pin 34 in the opposite direction and makes a lateral movement to the right hand side in the view of FIG. 2e. As a consequence, the sensor triggering element in the element carrier 20 made a lateral movement to the right hand side in the view of FIG. 2e such that it is now positioned to activate the position sensor on the right hand side in the horizontal path of position sensors.

The distance between the pivot pin 34 and the sensor triggering element, and the relative positioning of the hinge connection (socket 12 and ball 24) between link 8 and element carrier 20 are arranged such that there is a transmission or gear ratio larger than 1, i.e. the sensor triggering element travels over a larger distance than the lower end region of the shift lever to which link 8 is connected. This allows to place the position sensors 50 in the horizontal path at a larger distance to each other which ensures a reliable discrimination of the positioning since accidental activation of two adjacent position sensors is excluded.

What is claimed is:

1. A gearshift assembly for a transmission of a vehicle comprising:
    a shift lever mounted in a housing and pivotable about a first lever axis from a neutral position backwards and forwards, and pivotable about a second lever axis transverse to the first lever axis from the neutral position in a lateral direction,
    a position sensor assembly mounted in the housing and comprising a plurality of position sensors disposed in a distributed pattern including first and second paths of position sensors,
    a sensor triggering element mounted on an element carrier moveably mounted in the housing and coupled to the shift lever to enable movement of the sensor triggering element along said pattern of position sensors in response to pivotal shift movements of the shift lever about the first and second axes,
    wherein the pattern of position sensors is arranged in a plane next to the shift lever at a lower end region of the shift lever,
    wherein the element carrier is moveably supported by a guide structure in the housing, with the element carrier coupled by a hinge connection to a link with the link connected to the shift lever,
    wherein the coupling of the element carrier by the link to the shift lever and the guide structure of the element carrier are arranged such that the element carrier performs a linear movement in response to pivoting the shift lever about the first lever axis such that the sensor triggering element is moved along the first path of the pattern of position sensors transverse to the second lever axis, and the element carrier is pivoted about a pivot axis of the guide structure at a distance from the sensor triggering element in response to pivoting the shift lever about the second lever axis such that the sensor triggering element is pivoted along the second path of the pattern of position sensors, and
    wherein the first and second paths of the position sensors intersect each other.

2. The gearshift assembly according to claim 1, wherein the guide structure comprises a pivot pin in the housing and the element carrier comprises a fork portion having an elongated slot, with the pivot pin received in the elongated slot of the fork portion to enable the element carrier to perform the linear movement by allowing the pivot pin to slide relative to the elongated slot of the fork portion and to enable the element carrier to perform the pivotal movement by allowing the fork portion of the element carrier to pivot about the pivot pin.

3. The gearshift assembly according to claim 2, wherein the pivot axis is further defined as a first pivot axis and the gearshift assembly and the element carrier are arranged such that when the gearshift assembly is mounted in the vehicle and the shift lever is in the neutral position with respect to a second pivot axis, the first pivot axis is oriented perpendicular to a longitudinal direction of the vehicle, and the slot of the fork portion of the element carrier extends parallel to the longitudinal direction such that the element carrier performs the linear movement in the longitudinal direction in response to pivoting of the shift lever about the first lever axis such that the sensor triggering element moves along the first path of position sensors which extends in the longitudinal direction of the vehicle.

4. The gearshift assembly according to claim 3, wherein the fork portion of the element carrier is disposed at an end portion of the element carrier remote from the link and the shift lever in a forward direction, and wherein the opening of the elongated slot of the fork portion faces away from the link and the shift lever.

5. The gearshift assembly according to claim 1, wherein the hinge connection connecting the link to the element carrier is formed as a ball joint.

6. The gearshift assembly according to claim 1, wherein the link is connected to the shift lever by a swivel connection which comprises a mounting pin formed at the lower end region of the shift lever with the mounting pin having two opposite end portions, and the link is formed with a bifurcated end portion being provided with two opposite holes in legs of the bifurcated end portion facing each other for receiving the opposite end portions of the mounting pin.

7. The gearshift assembly according to claim 1, wherein the link, the element carrier, and the pivot pin of the guide structure are arranged such that a movement of the shift lever end region about the second lever axis is transmitted to a movement of the sensor triggering element with a transmission ratio of greater than 1.

8. The gearshift assembly according to claim 1, wherein the first and second paths of the position sensors are perpendicular to each other.

9. A gearshift assembly for a transmission of a vehicle, said gearshift assembly comprising:
    a housing;
    a shift lever mounted in said housing and pivotable about a first lever axis from a neutral position backwards and forwards and pivotable about a second lever axis from the neutral position in a lateral direction, and said shift lever having a lower end region;
    a position sensor assembly mounted in said housing and comprising a plurality of position sensors disposed in a distributed pattern including first and second paths of position sensors with said position sensors arranged in a plane next to said lower end region of said shift lever;
    an element carrier moveably mounted in said housing and coupled to said shift lever;
    a link connected to said shift lever by a hinge connection and the link coupled to said element carrier;
    a sensor triggering element mounted on said element carrier;
    wherein said element carrier enables movement of said sensor triggering element along said pattern including said first and second paths of position sensors in response to pivotal shift movements of said shift lever about said first and second lever axes; and a guide structure within said housing and defining a pivot axis, wherein said element carrier is coupled to and moveably supported by said guide structure in said housing, wherein said coupling of said element carrier to said shift lever by said link and said coupling of said element carrier to said guide structure are arranged such that said element carrier performs a linear movement in response to pivoting of said shift lever about said first lever axis to move said sensor triggering element along said first path of position sensors transverse to said second lever axis, and said element carrier pivots about said pivot axis of said guide structure at a distance from said sensor triggering element in response to pivoting said shift lever about said second lever axis to pivot said sensor triggering element along said second path of position sensors, and wherein the first and second paths of the position sensors intersect each other.

10. The gearshift assembly according to claim 9 wherein said guide structure has a pivot pin defining said pivot axis and said element carrier has a fork portion defining an elongated slot with said pivot pin received in said elongated slot to enable said linear movement of said element carrier relative to said pivot pin as said shift lever pivots along said first lever axis.

11. The gearshift assembly according to claim 9 wherein said guide structure has a pivot pin defining said pivot axis and said element carrier has a fork portion defining an elongated slot with said pivot pin received in said elongated slot to enable said pivoting of said element carrier relative to said pivot pin as said shift lever pivots about said second lever axis.

12. The gearshift assembly according to claim 9 wherein said guide structure has a base, a pair of guide walls extending from said base, and a pivot pin extending from said base between said guide walls and said element carrier has a fork portion defining an elongated slot with said fork portion disposed between said guide walls and said pivot pin received in said elongated slot to enable said linear movement of said element carrier relative to said guide walls and said pivoting of said element carrier relative to said pivot pin.

13. The gearshift assembly according to claim 9 wherein said element carrier has an end portion defining a fork portion and said element carrier is arranged such that said fork portion faces away from said link and away from said shift lever.

14. The gearshift assembly according to claim 9 wherein said element carrier has a ball and said link defines a socket for receiving said ball to form a ball joint connection between said element carrier and said link.

15. The gearshift assembly according to claim 9 wherein said position sensor assembly includes a printed circuit board having opposing upper and lower surfaces with said upper surface facing away from said lower end region of said shift lever and said lower surface toward said lower end region of said shift lever, with said plurality of position sensors attached to said lower surface and facing toward said lower end region of said shift lever.

16. The gearshift assembly according to claim 15 wherein said sensor triggering element mounted on said element carrier faces toward said plurality of position sensors attached to said lower surface of said printed circuit board.

17. The gearshift assembly according to claim 9 wherein said first path of position sensors is arranged along said first lever axis and said second path of said position sensors is arranged along said second lever axis.

18. The gearshift assembly according to claim 9 wherein said second path of said position sensors is perpendicular said first path of said position sensors.

19. A gearshift assembly for a transmission of a vehicle, said gearshift assembly comprising:

a housing;

a shift lever mounted in said housing and pivotable about a first lever axis from a neutral position backwards and forwards and pivotable about a second lever axis from the neutral position in a lateral direction, and said shift lever having a lower end region;

a position sensor assembly mounted in said housing and comprising a plurality of position sensors disposed in a distributed pattern including first and second paths of position sensors with said position sensors arranged in a plane next to said lower end region of said shift lever, wherein said first path of position sensors is arranged along said first lever axis and said second path of said position sensors is arranged along said second lever axis;

an element carrier moveably mounted in said housing and coupled to said shift lever;

a link connected to said shift lever by a hinge connection and the link coupled to said element carrier;

a sensor triggering element mounted on said element carrier;

wherein said element carrier enables movement of said sensor triggering element along said pattern including said first and second paths of position sensors in response to pivotal shift movements of said shift lever about said first and second lever axes; and a guide structure within said housing and defining a pivot axis, wherein said element carrier is coupled to and moveably supported by said guide structure in said housing, and wherein said coupling of said element carrier to said shift lever by said link and said coupling of said element carrier to said guide structure are arranged such that said element carrier performs a linear movement in response to pivoting of said shift lever about said first lever axis to move said sensor triggering element along said first path of position sensors transverse to said second lever axis, and said element carrier pivots about said pivot axis of said guide structure at a distance from said sensor triggering element in response to pivoting said shift lever about said second lever axis to pivot said sensor triggering element along said second path of position sensors.

* * * * *